United States Patent
Gluschenkov et al.

(10) Patent No.: US 10,804,270 B2
(45) Date of Patent: Oct. 13, 2020

(54) CONTACT FORMATION THROUGH LOW-TEMPEARATURE EPITAXIAL DEPOSITION IN SEMICONDUCTOR DEVICES

(71) Applicant: International Business Machines Corporation, Armonk, NY (US)

(72) Inventors: Oleg Gluschenkov, Tannersville, NY (US); Shogo Mochizuki, Clifton Park, NY (US); Hiroaki Niimi, Albany, NY (US); Tenko Yamashita, Schenectady, NY (US); Chun-chen Yeh, Clifton Park, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 307 days.

(21) Appl. No.: 15/787,011

(22) Filed: Oct. 18, 2017

(65) Prior Publication Data
US 2019/0115347 A1  Apr. 18, 2019

(51) Int. Cl.
*H01L 27/092* (2006.01)
*H01L 29/417* (2006.01)
(Continued)

(52) U.S. Cl.
CPC .... *H01L 27/0924* (2013.01); *H01L 21/02293* (2013.01); *H01L 21/244* (2013.01); *H01L 21/283* (2013.01); *H01L 21/823821* (2013.01); *H01L 29/41791* (2013.01)

(58) Field of Classification Search
CPC . H01L 27/0924; H01L 21/244; H01L 21/283; H01L 29/41791; H01L 21/02293
(Continued)

(56) References Cited

U.S. PATENT DOCUMENTS 7,910,448 B2  3/2011  Meunier-Beillard et al.
8,772,159 B2  7/2014  Tseng et al.
(Continued)

FOREIGN PATENT DOCUMENTS

CN    104851783 A     8/2015
CN    103000499 B    12/2015
(Continued)

OTHER PUBLICATIONS

List of IBM related Applications, Appendix P, 2018.
(Continued)

*Primary Examiner* — Caleen O Sullivan
(74) *Attorney, Agent, or Firm* — Garg Law Firm, PLLC; Rakesh Garg; Joseph Petrokaitis

(57) ABSTRACT

A semiconductor material layer is deposited on a p-type source/drain region of a p-type transistor device and an n-type source/drain region of an n-type transistor device. The p-type device transistor device and the n-type transistor device are formed on a substrate of a semiconductor device. The semiconductor device includes a trench formed through an inter-level dielectric layer. The inter-level dielectric layer is formed over the n-type transistor device and the p-type transistor device. The trench exposes the p-type source/drain region of the p-type transistor device and the n-type source/drain region of the n-type transistor device. An element is implanted in the semiconductor material layer to form an amorphous layer on p-type source drain region and the n-type source/drain region. The amorphous layer is annealed to form a first metastable alloy layer upon the p-type source/drain region and a second metastable alloy layer upon the n-type source/drain region.

12 Claims, 13 Drawing Sheets

(51) Int. Cl.
    *H01L 21/24* (2006.01)
    *H01L 21/283* (2006.01)
    *H01L 21/02* (2006.01)
    *H01L 21/8238* (2006.01)

(58) Field of Classification Search
    USPC .......................................................... 257/369
    See application file for complete search history.

(56) References Cited

U.S. PATENT DOCUMENTS

| | | |
|---|---|---|
| 9,437,717 B2 | 9/2016 | Chan et al. |
| 2015/0255555 A1 | 9/2015 | Xie et al. |
| 2016/0293756 A1 | 10/2016 | Liu et al. |
| 2016/0322359 A1 | 11/2016 | Glass et al. |
| 2018/0277541 A1* | 9/2018 | Gluschenkov ...... H01L 27/0924 |

FOREIGN PATENT DOCUMENTS

| | | |
|---|---|---|
| CN | 105679809 A | 6/2016 |
| WO | 2016105400 A1 | 6/2016 |

OTHER PUBLICATIONS

Gluschenkov et al; FinFET performance with Si:P and Ge:Group-III-Metal Metastable Contact Trench Alloys, 2016.
Niimi et al; Sub-10-9 W-cm2 N-type Contact Resistivity for FinFET Technology, DOI 10.1109/LED.2016.2610480, IEEE.

* cited by examiner

CONTACT FORMATION THROUGH LOW-TEMPEARATURE EPITAXIAL DEPOSITION IN SEMICONDUCTOR DEVICES

TECHNICAL FIELD

The present invention relates generally to a method for fabricating contacts in semiconductor device structures and an apparatus formed by the method. More particularly, the present invention relates to a method for fabricating contacts for a p-type field effect transistor (pFET) device and an n-type field effect transistor (nFET) device on a common substrate through low-temperature epitaxial deposition and an apparatus formed by the method.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in rigid plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation is controlled to achieve the desired shape and electrical characteristics on the wafer.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the free charged carriers and consequently the electrical conductivity of a channel between the source and the drain. The channel is a charge carrier pathway constructed using a semiconductor material.

Many semiconductor devices are planar, i.e., where the semiconductor structures are fabricated on one plane. A non-planar device is a three-dimensional (3D) device where some of the structures are formed above or below a given plane of fabrication.

A fin-Field Effect Transistor (finFET) is a non-planar device in which a source and a drain are connected using a fin-shaped conducting channel (fin).

Accordingly, the direction of electrical current is along the lateral length of the fin running from the source to the drain is referred to herein as a lateral running direction of the current.

The illustrative embodiments recognize that the present methods and techniques for fabricating electrical contacts for p-type field effect transistor (pFET) device and an n-type field effect transistor (nFET) device on a common substrate suffer from several problems. For example, in conventional contact formation use of a reactive-ion etching (RIE) process during fabrication may cause contact damage from plasma and leave polymer residue at the bottom of the contact trench of the semiconductor. In addition, traces of silicon nitride (SiN) may remain in the trench. As a result of the poor surface condition of the trench, contacts formed in this manner may produce an undesirable increase in contact resistance at the metal-semiconductor (M-S) junction. In addition, gouging of the source-drain (SD) epitaxial layer may occur encroaching upon the fin structure of the semiconductor.

The illustrative embodiments recognize that it is difficult to fabricate contacts for a p-type field effect transistor (pFET) device and an n-type field effect transistor (nFET) device on the same substrate while maintaining a low contact resistance between the metallic contacts and semiconductor material of the FET body for both the pFET device and the nFET device. Therefore, a method for fabricating contacts for a p-type field effect transistor (pFET) device and an n-type field effect transistor (nFET) device on a common substrate while maintaining a low contact resistance between the contacts and semiconductor material of the FET body for both the pFET device and the nFET device would be useful.

SUMMARY

The illustrative embodiments provide a method and apparatus. An embodiment of a method for fabricating a semiconductor device includes depositing a semiconductor material layer on a p-type source/drain region of a p-type transistor device and an n-type source/drain region of an n-type transistor device. The p-type device transistor device and the n-type transistor device are formed on a substrate of a semiconductor device. The semiconductor device includes a trench formed through an inter-level dielectric layer. The inter-level dielectric layer is formed over the n-type transistor device and the p-type transistor device. The trench exposes the p-type source/drain region of the p-type transistor device and exposes the n-type source/drain region of the n-type transistor device. The embodiment further includes implanting an element in the semiconductor material layer to form an amorphous layer on p-type source/drain region and the n-type source/drain region. The embodiment further includes annealing the amorphous layer to form a first metastable alloy layer upon the p-type source/drain region and a second metastable alloy layer upon the n-type source/drain region. An advantage provided by at least one embodiment includes fabricating a semiconductor device having a p-type transistor device and an n-type transistor device on a common substrate while maintaining a low contact resistance between contacts and semiconductor material for both the p-type transistor device and the n-type transistor device.

An embodiment further includes depositing at least one metal liner layer upon the p-type source drain region and the n-type source/drain region. An embodiment further includes forming metal wires to the p-type source/drain region and the n-type source/drain region.

An embodiment further includes annealing the first and the second metastable alloy layers and the metal layer to form a metal-semiconductor metallic compound at interfaces of the first and the second metastable alloy layers and the metal layer.

In an embodiment, the semiconductor material layer comprises a low-temperature silicon (Si) layer of less than 5 nanometer thick deposited at temperature of less than 500 C. In another embodiment, the semiconductor material layer comprises a low-temperature silicon germanium (SiGe) layer of less than 10 nanometer thick deposited at temperatures of less than 500 C.

In an embodiment, the implanting of the element to form the amorphous layer comprises implanting an electrically neutral element selected from one of silicon (Si), germanium (Ge), or noble gases. In an embodiment, the annealing comprises a millisecond annealing at or above recrystallization temperature of amorphous layers. In an embodiment, the annealing comprises a nanosecond annealing at or above melting temperature of amorphous layers.

In an embodiment, the implanting of the element to form the amorphous layer comprises of implanting a first dopant element of a first polarity, blocking the device of the first polarity by a block mask, and implanting a second dopant element of a second polarity into the device of the second polarity. Another embodiment includes etching an amorphous layer of the first polarity prior to implanting a dopant element of the second polarity.

In an embodiment, the dopant element of the first polarity is selected from Gallium (Ga) or Boron (B) and the dopant element of the second polarity is selected from Phosphorus (P) or Arsenic (As). In an embodiment, an implanted dose of the dopant element of the second polarity is larger than an implanted dose of the dopant element of the first polarity.

An embodiment of an apparatus includes an n-type transistor device with an n-type source/drain region and a p-type transistor device with a p-type source/drain region formed on a substrate, and contact trenches formed through an inter-level dielectric layer to the respective source/drain regions, the inter-level dielectric layer being formed over the n-type transistor device and the p-type transistor device. In the embodiment, the p-type source/drain regions contain a first metastable semiconductor-dopant alloy with a first concentration of p-type dopant. In the embodiment, the n-type source/drain regions contain a second metastable semiconductor-dopant alloy with a second concentration of n-type dopant. In the embodiment, the contact trenches contain a metallic material, and the second dopant concentration is larger than the first dopant concentration.

In an embodiment, the first metastable semiconductor-dopant alloy comprises a $Si_{1-y}Ge_y$:B/Ga alloy with content of Ge of more than 0.5 and concentration of [B/Ga] at or more than 5 atomic percent. In an embodiment, the first metastable semiconductor-dopant alloy comprises of silicon-dopant Si:P/As alloy with the concentration of [P/As] at or more than 5 atomic percent. In an embodiment, the metallic material of the contact trenches includes Titanium (Ti) and interfaces between the metastable semiconductor-dopant alloys and the metallic material of the contact trenches include titanium silicides (TiSi) and titanium germano-silicides (TiGeSi).

In an embodiment, the trench exposes the p-type source/drain region of the p-type transistor device and exposes the n-type source/drain region of the n-type transistor device. In an embodiment, the apparatus further includes at least one metal layer deposited upon the p-type source/drain region and the n-type source/drain region. In an embodiment, the apparatus further includes metal wires formed to the p-type source/drain region and the n-type source/drain region.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
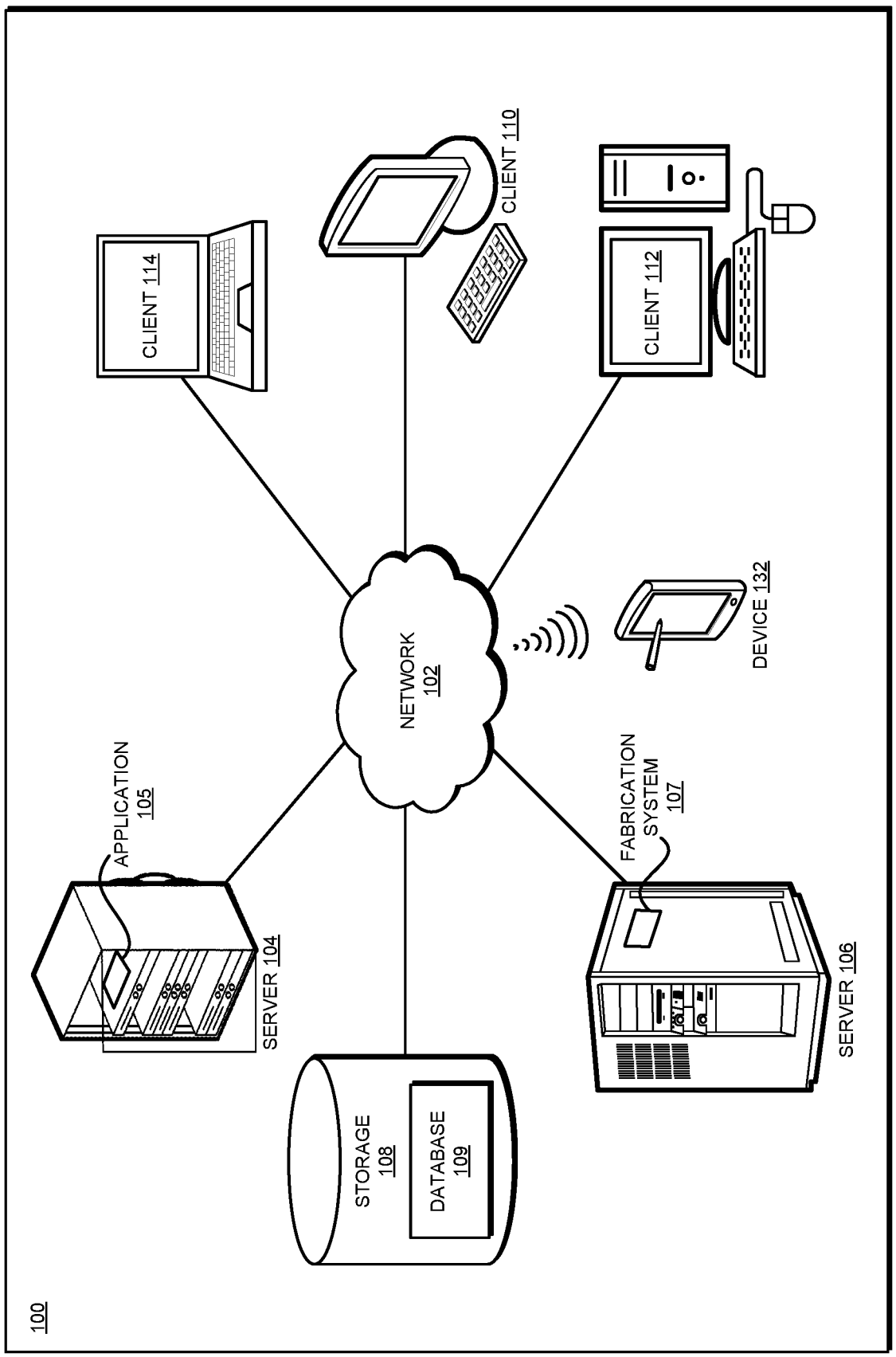
FIG. 1 depicts a block diagram of a network of data processing systems in which illustrative embodiments may be implemented.

The illustrative embodiments used to describe the invention generally address and solve the above-described problems and other problems related to fabricating contacts for p-type field effect transistor (pFET) devices and an n-type field effect transistor (nFET) devices on the same substrate while maintaining a low contact resistance between metallic contacts and semiconductor material of the FET body for both the pFET devices and the nFET devices.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate contacts for p-type field effect transistor (pFET) devices and an n-type field effect transistor (nFET) devices on the same substrate.

For the clarity of the description, and without implying any limitation thereto, the illustrative embodiments are described using a single p-finFET device and a single n-finFET device. An embodiment can be implemented with a different number of nFETs and pFETs, different number of fins for each of the FETs, or both, within the scope of the illustrative embodiments. Furthermore, the transistor channel can have its shape and geometrical orientation other than the ones found in finFETs including but not limiting to planar, surround-gate, multiple-gate, nano-wire or nano-sheet, and vertical channels. The nFETs and pFETs can be wired into a number of useful circuits such as CMOS logic circuits (e.g. NAND and NOR), memory cells (e.g. SRAM), analog circuits (e.g. PLL), and input/output (I/O) circuits.

Furthermore, a simplified diagram of the example pFET devices and nFET devices are used in the figures and the illustrative embodiments. In an actual fabrication of a pFET device or nFET device, additional structures that are not shown or described herein may be present without departing the scope of the illustrative embodiments. Similarly, within the scope of the illustrative embodiments, a shown or described structure in the example pFETs and nFETs may be fabricated differently to yield a similar operation or result as described herein.

Differently shaded portions in the two-dimensional drawing of the example pFETs and nFETs are intended to represent different structures in the example pFETs and nFETs, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating a pFET and/or nFET according to the illustrative embodiments.

Furthermore, the illustrative embodiments are described with respect to a pFET or nFET only as an example. The steps described by the various illustrative embodiments can be adapted for fabricating other planar and non-planar devices, and such adaptations are contemplated within the scope of the illustrative embodiments.

An embodiment when implemented in a software application causes a fabrication system to performs certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a manufacturing device, tool, or data processing system, comprises substantial advancement of the functionality of that manufacturing device, tool, or data processing system in fabricating contacts for a p-type field effect transistor (pFET) device and an n-type field effect transistor (nFET) device on the same substrate. For example, presently available methods recognize that it is difficult to fabricate contacts for a p-type field effect transistor (pFET) device and an n-type field effect transistor (nFET) device on the same substrate while maintaining a low contact resistance between the metallic contacts and semiconductor material of the FET body for both the pFET device and the nFET device. An embodiment provides a method for fabricating contacts for a p-type field effect transistor (pFET) device and an n-type field effect transistor (nFET) device on the same substrate while maintaining a low contact resistance between the contacts and semiconductor material of the FET body for both the pFET device and the nFET device. Thus, a substantial advancement of such manufacturing devices, tools, or data processing systems results in improved semiconductor devices in which it is desired to have a mixture of pFET devices and nFET devices on the same semiconductor substrate or wafer, such as a complimentary metal-oxide semiconductors (CMOS) semiconductor device.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
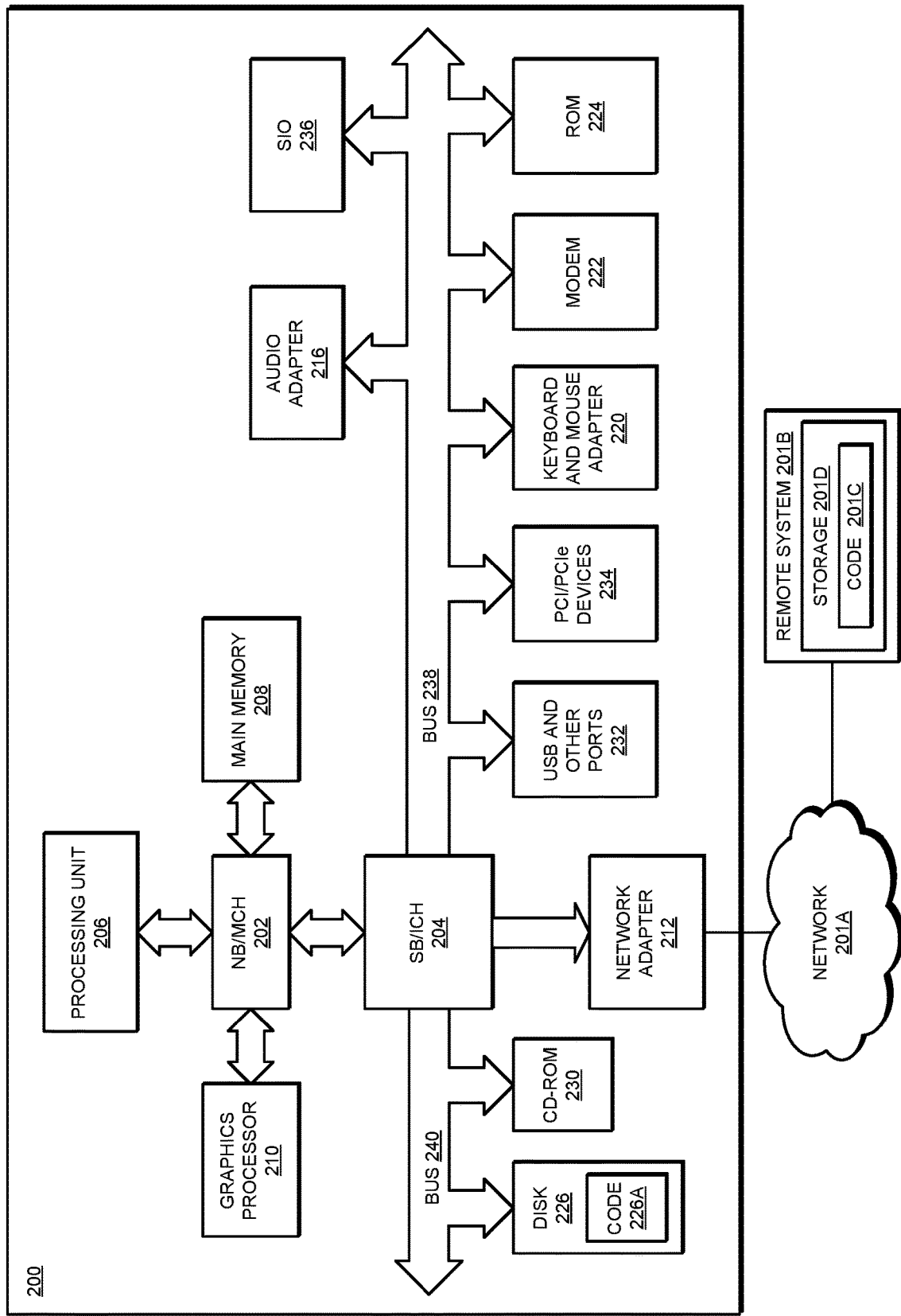
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be Implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication control system 107 is any suitable control system for controlling manufacturing equipment and sequencing process steps during fabrication of a semiconductor device. Fabrication control system 107 also implements an embodiment described herein. In a non-limiting example, application 105 represents a recipe program within a particular manufacturing device or tool. The recipe program controls tool physical process parameters (e.g. process temperature, ambient, pressure, precursor gas flows, process step duration, ion beam energy, ion beam dose, and others) during semiconductor substrate processing within a single manufacturing tool. In one or more embodiments, fabrication control system 107 controls the semiconductor substrate processing flow, i.e. fabrication control system 107 is responsible for selecting a sequence of manufacturing devices or tools and a proper recipe program or application 105 for each tool in the sequence. Accordingly, applications 105 and fabrication control system 107 provide instructions for fabricating contacts for p-type field effect transistor (pFET) devices and an n-type field effect transistor (nFET) devices on the same substrate in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers. Apart from storing and executing applications 105 and fabrication control system 107, in various embodiments the network 102 with servers 104, 106 and other elements allows for a full control of entire semiconductor manufacturing process including routing, dispositioning, and monitoring the work in progress, collecting and storing vital processing data, and enabling quality control. In one or more embodiments clients 110, 112, 114 enable an input, visualization, and editing of application 105 and elements within the fabrication control system 107 such as the process flow as well as a retrieval and visualization of various data used or collected during manufacturing of semiconductor devices.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may include the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 and fabrication control system 107 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
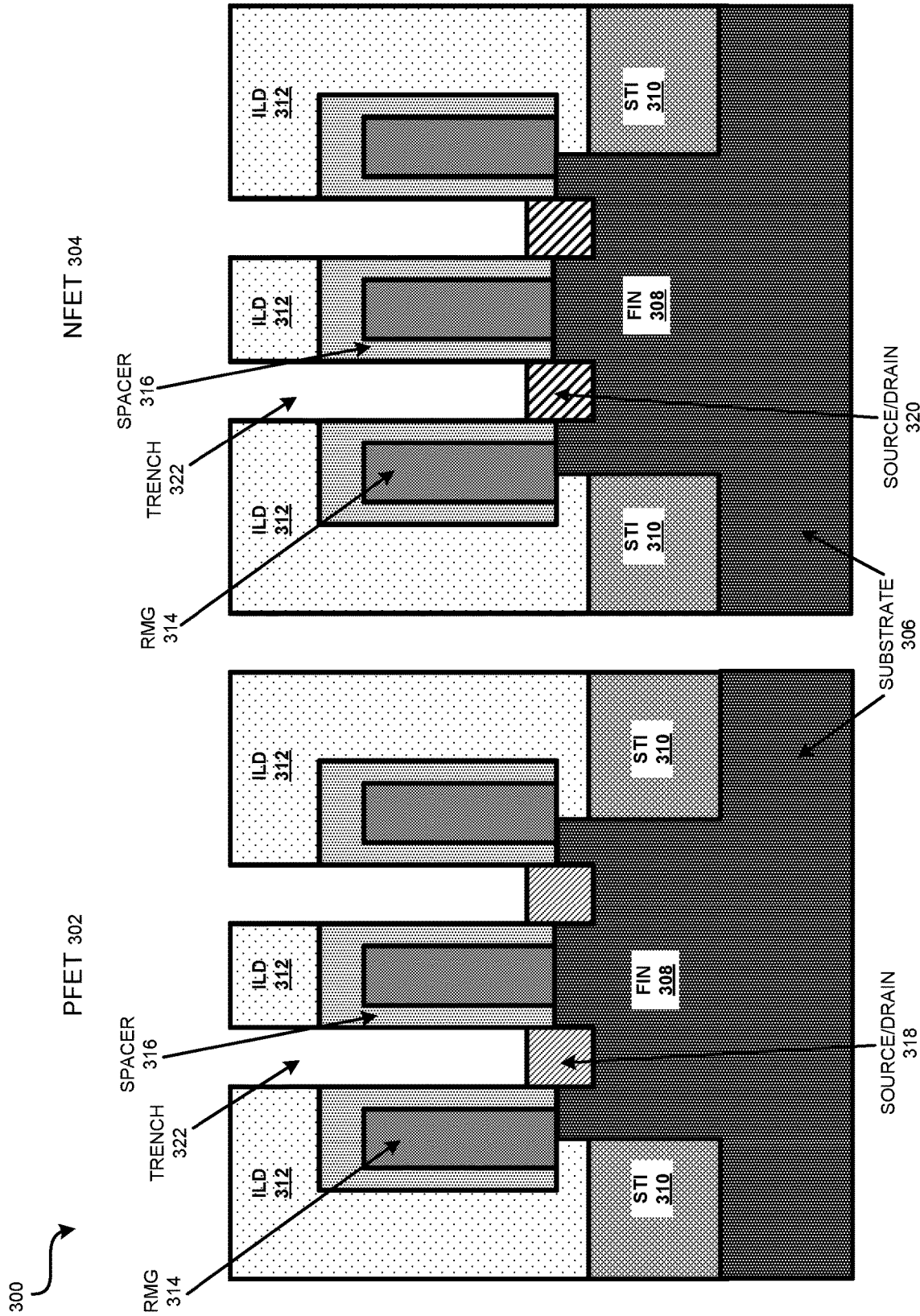
FIG. 3 depicts a portion of a process according to an illustrative embodiment.

With reference to FIGS. 3-12, these figures depict an example process for fabricating contacts for a p-type field effect transistor (pFET) device and an n-type field effect transistor (nFET) device with reduced contact resistance on a common substrate in accordance with one or more illustrative embodiments. With reference to FIG. 3, FIG. 3 depicts a portion of a process according to an illustrative embodiment in which a substrate structure 300 including a pFET device 302 and nFET device 304 on a common substrate 306 (or wafer) shown in a cross-sectional view is received by the manufacturing fabrication system controlled by application 105 and fabrication control system 107. In the illustrated embodiment, substrate 306 includes fins 308 formed on substrate 306. In one or more embodiments, fins 308 can be formed by a process known to one skilled in the art such as by a lithographic or etching process. In a particular embodiment, fins 308 are formed by a reactive ion etching process.

In the particular embodiments illustrated in FIGS. 3-12, a single pFET device 302 and a single nFET 304 are fabricated upon a single common substrate and/or wafer. In the particular embodiment, the pFET device 302 and nFET device 304 appear to be separated for illustration purposes. It should be understood that in other embodiments, any combination of pFET devices and nFET devices may be fabricated on a single common substrate in a similar manner.

Substrate structure 300 includes shallow trench isolation (STI) regions 310 adjacent to fins 308. In particular embodiments, STI regions 310 can be formed by, any suitable process including, for example, lithography or etching to form trenches, and then filling the trenches with an insulating material, such as silicon dioxide. STI regions 310 provides isolation between neighboring source/drain structure regions of different semiconductor devices, such as separating a pFET device from an nFET device. In the illustrated embodiment, pFET device 302 and nFET device 304 include an inter-level dielectric (ILD) layer 312, replacement metal gates (RMGs) 314, and a spacer layer 316. In one or more embodiments, fins 308, STI regions 310, ILD 312, spacer layer 316, and RMGs 314 are formed using conventional processes as known to one skilled in the art.

In one or more embodiments, ILD layer 312 is formed from, for example, a low-k dielectric material (typically materials with dielectric constant of k<4.0), including but not limited to, silicon oxide, spin-on-glass, a flowable oxide, a high density plasma oxide, borophosphosilicate glass (BPSG), or any combination thereof. The inter-level dielectric layer 312 can be deposited by a deposition process, including, but not limited to chemical vapor deposition (CVD), physical vapor deposition (PVD), plasma enhanced CVD, atomic layer deposition (ALD), evaporation, chemical solution deposition, or like processes.

In one or more embodiments, RMG 314 is a gate stack. The gate stack typically includes high-k metal gates formed, for example, with one or more gate dielectric materials, one or more workfunction metals on the gate dielectric materials, and one or more metal gate conductor materials. The gate dielectric material(s) can be a dielectric material having a dielectric constant greater than 3.9, 7.0, or 10.0. Non-limiting examples of suitable materials for the gate dielectric materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

In particular embodiments, the gate dielectric materials can be formed by suitable deposition processes, for example, CVD, plasma-enhanced chemical vapor deposition (PECVD), ALD, evaporation, PVD, chemical solution deposition, or other like processes. The thickness of the dielectric material can vary depending on the deposition process as well as the composition and number of high-k dielectric materials used. The gate dielectric material layer can have a thickness in a range from about 0.5 to about 20 nm.

In RMG 314, the work function metal(s) can be disposed over the gate dielectric material. The type of work function metal(s) depends on the type of transistor and can differ between the nFET and pFET devices. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

In RMG 314, the gate conductor material(s) is deposited over the gate dielectric material(s) and work function metal(s) to form the gate stack in one or more embodiments. Non-limiting examples of suitable conductive metals include aluminum (Al), platinum (Pt), gold (Au), tungsten (W), cobalt (Co), titanium (Ti), or any combination thereof. In particular embodiments, the gate conductor material(s) can be deposited by a suitable deposition process, for example, CVD, PECVD, PVD, plating, thermal or e-beam evaporation, and sputtering.

In the illustrated embodiment, pFET device 302 includes a p-type source/drain (SD) region 318, and nFET device 304 includes an n-type source/drain (SD) region 320. In the illustrated exemplary embodiment, p-type SD region 150 includes silicon-germanium (SiGe) material doped, for example, with boron (B), and n-type SD region 320 includes silicon (Si) material doped, for example, with phosphorous (P). In one or more embodiments, the boron doped silicon-germanium (e.g. SiGe:B) and the phosphorous (P) doped silicon (Si:P) is added to p-type SD region 318 and n-type SD region 320, respectively, by a combination of a fin recess, an epitaxial process such as epitaxial growth, ion implantation, solid phase epitaxial re-growth (SPE), or laser-induced liquid phase epitaxial re-growth (LPE). In particular embodiments, the specific composition of the source/drain material is selected to enable a low-resistivity current path to and from the transistor channel. While forming source/drain regions, the dopants placed in regions 318,320 are diffused out or otherwise placed underneath the spacer 316 to form an overlap with the respective edges of RMG stack 314.

In particular embodiments, epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition", "epitaxially formed and/or grown", and "epi" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

In the illustrated embodiment, trenches 322 are formed through ILD layer 312 and spacer layer 316 adjacent to RMGs 314 to expose the p-type SD region 318 and nFET SD region 320. In one or more embodiments, trenches 322 are formed using self-aligned contact reactive ion etching (RIE). Non-limiting examples of suitable materials for the spacer material of spacers 316 include dielectric nitrides (e.g., silicon nitride), dielectric oxynitrides, SiBCN, SiOCN, SiOC, dielectric oxides (e.g., silicon oxide), or any combination thereof. The layer of spacer material is deposited by a suitable deposition process, for example, CVD or ALD.

Figure 4:
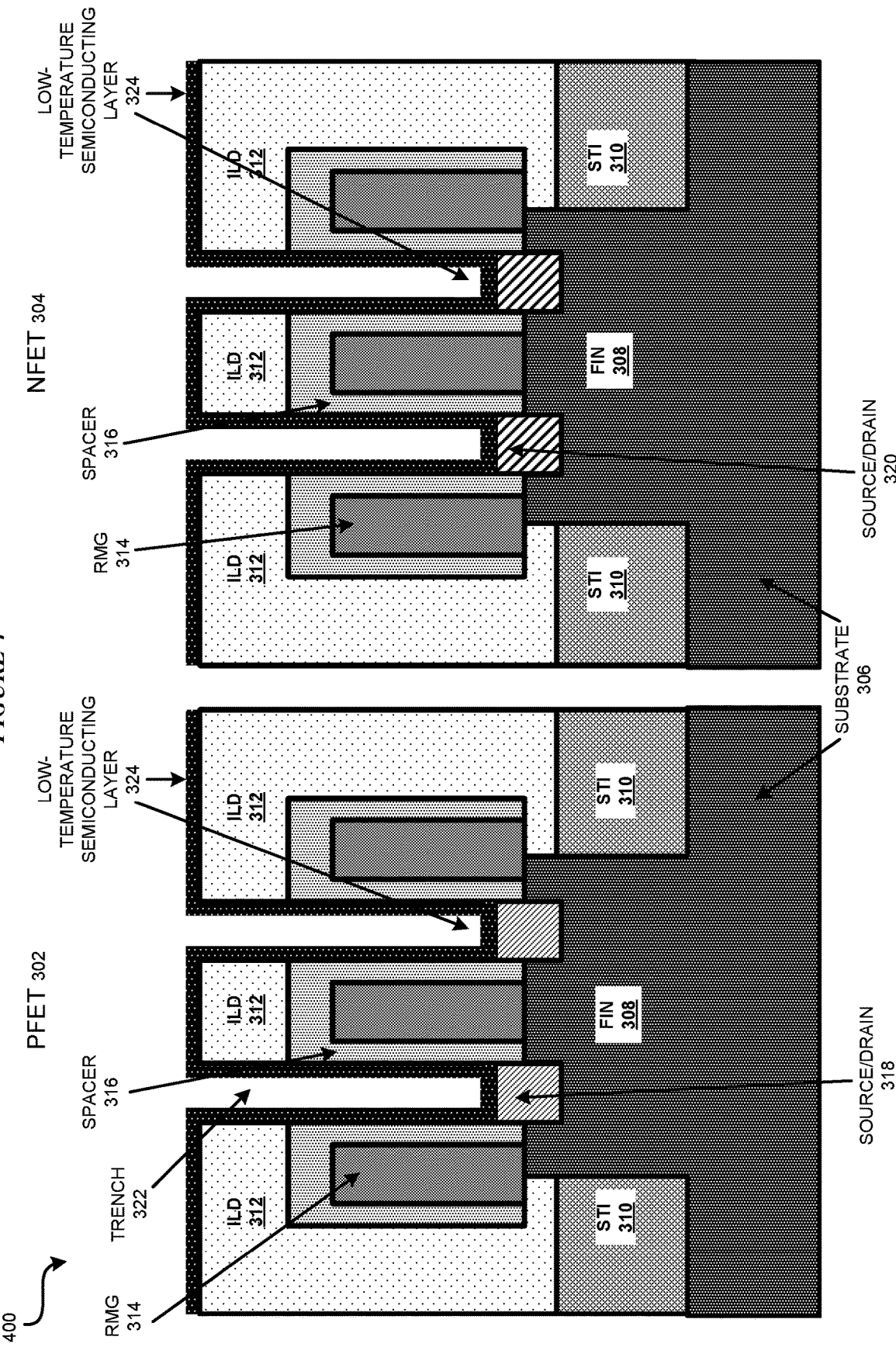
FIG. 4 depicts another portion of a process according to an illustrative embodiment.

With reference to FIG. 4, FIG. 4 depicts another portion of a process in which a structure 400 is formed according to an embodiment. In one or more embodiments, the manufacturing fabrication system controlled by application 105 and fabrication control system 107 deposits a semiconducting layer 324 at a low-temperature of less than about 500° C. upon pFET 302 including p-type SD region 318 and nFET 304 including n-type SD region 320. The low-temperature requirement is due to the presence of temperature sensitive RMG gate stack 314. In particular embodiments, the semiconducting layer 324 is comprised of silicon (Si). In particular embodiments, fabrication system 107 deposits a low-temperature Si layer 324 using an epitaxial growth process. The epitaxial process may include a surface cleaning step where surfaces of regions 318 and 320 are cleaned and stripped off any native oxide that may have been formed by an inadvertent exposure to the ambient air. A portion of the cleaning step is preferably conducted in-situ within the epitaxial deposition equipment to minimize any exposure to oxidizing ambient immediately prior to the deposition. A typical epitaxial cleaning step includes the thermal desorption step conducted in hydrogen ambient at temperatures above about 750° C. The low-temperature requirement imposed by the presence of RMG gate stack 314 limits the temperature of thermal desorption to below about 500° C. at which point the thermal desorption of fully-formed silicon dioxide is not effective. The preferred epitaxial process uses an in-situ chemical oxide etch that removes surface silicon dioxide followed by an in-situ thermal desorption in hydrogen ambient at 450° C. for several tens of seconds followed by Si epitaxial growth at 450° C. for several hundreds of seconds using disilane ($Si_2H_6$) as silicon precursor. At this low deposition temperature, the silicon epitaxial process is considered to be non-selective. In a non-selective Si deposition process, deposition of the Si occurs over the entire surface of pFET 302 and nFET 304. In contrast, in a selective deposition process the semiconductor material deposits on semiconductor surfaces and generally does not deposit on other exposed surfaces such as dielectric surfaces such as silicon dioxide and silicon nitride surfaces. However, in a particular embodiment, low-temperature Si layer 324 is in a range of 1-3 nanometers thick or only 2-6 monolayers of epitaxial silicon. In this ultra-thin regime, a different speed of nucleating Si material on the surfaces of crystalline semiconducting material 318 and 320 and dielectric material 312 and 316 may result in different thickness of resultant Si layer 324 formed over these dissimilar surfaces.

The resultant layer 324 is typically thinner over dielectric surfaces and can be discontinuous or be absent over portions of these surfaces. Furthermore, the resultant layer 324 can be thinner over p-type SiGe SD region 318 than over n-type Si SD region 320. In an alternative embodiment, the semiconducting layer 324 can be comprised of silicon (Si) layer capped with SiGe or pure Ge layer. The cap layer is deposited using a low-temperature epitaxial growth process with both silicon and germanium precursors. Disilane ($Si_2H_6$) and Germane ($GeH_4$) can be used as silicon and germanium precursors, respectively. The concentration of Ge in the cap is preferably above Ge concentration in p-type SD region 318 and is above 50%. In particular embodiments, the thickness of such SiGe or Ge cap of Si layer 324 is from about 2 nm to about 10 nm. The cap is removed from n-type SD region 320 selectively to the underlying Si layer in subsequent steps with the use of block mask.

Figure 5:
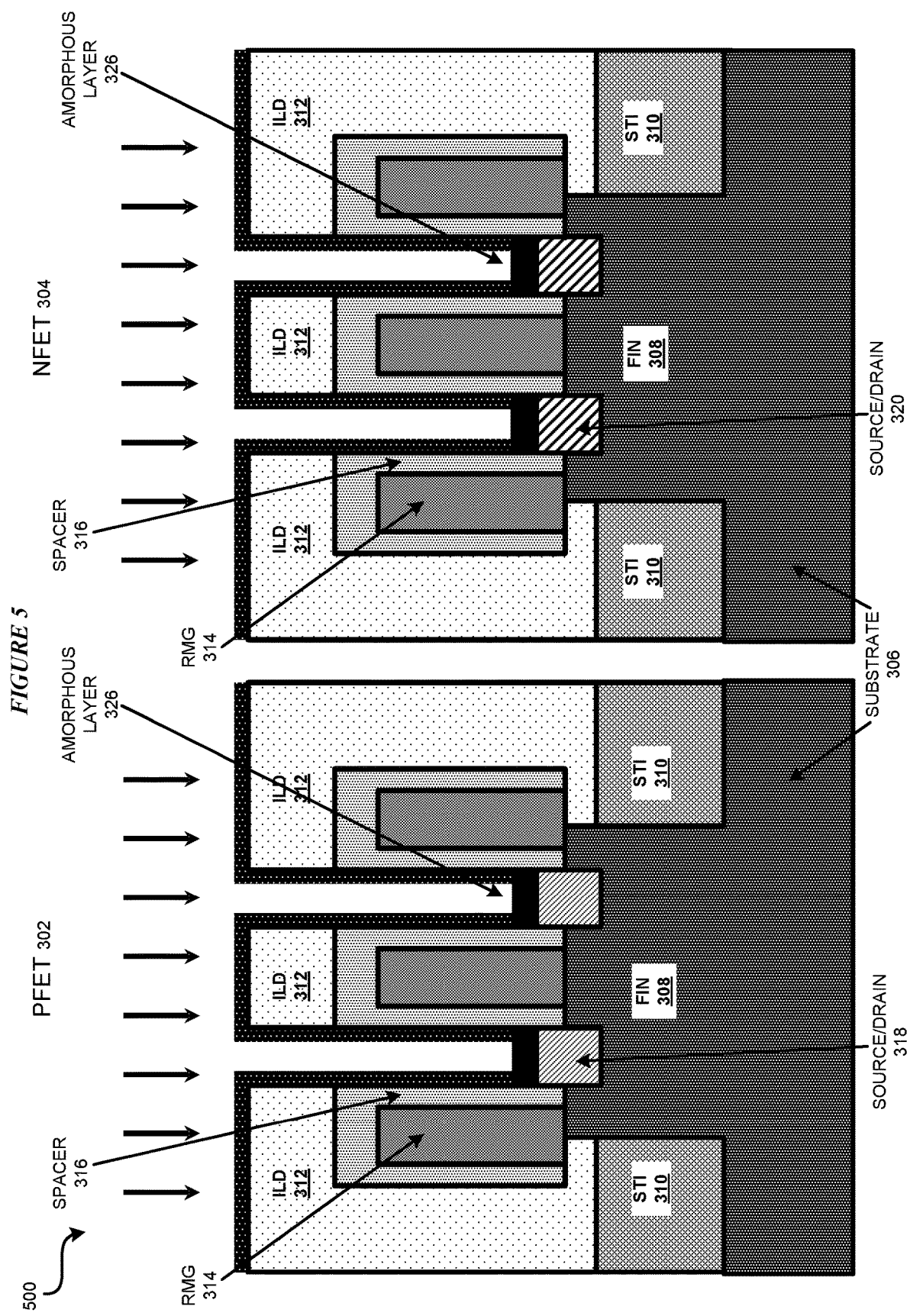
FIG. 5 depicts another portion of a process according to an illustrative embodiment.

With reference to FIG. 5, FIG. 5 depicts another portion of a process in which a structure 500 is formed according to an embodiment. In one or more embodiments, the manufacturing fabrication system controlled by application 105 and fabrication control system 107 implants an element in low-temperature semiconducting layer 324 and a top portion of p-type SD region 318 and n-type SD region 320 to form an amorphous layer 326 in a top portion of p-type SD region 318 and n-type SD region 320. In particular embodiments, the element is an atom that is neutral to both p-type SD region 318 and n-type SD region 320 such that the element does not significantly alter the chemical structure of p-type SD region 318 and n-type SD region 320 such as silicon (Si), germanium (Ge), or noble gases (e.g., Ne, Ar, Xe). In an alternative embodiment, two masks can be used to implant one type of doping element on the p-type side and another type of doping element on the n-type side. For such embodiment, the preferred element for the p-type side is Gallium (Ga) and for the n-type side is Phosphorus (P). If SiGe cap is present in layer 324, the block mask that opens n-type side and blocks p-type side can be used for selective removal of SiGe cap from the n-type side prior to any n-type dopant implant. In still another alternative embodiment, a single n-type (e.g. P) or p-type (e.g. Ga) doping element can be used on both the p-type side and the n-type side without any block mask followed by its selective removal and/or counterdoping with an opposite doping element utilizing a single block mask.

Figure 6:
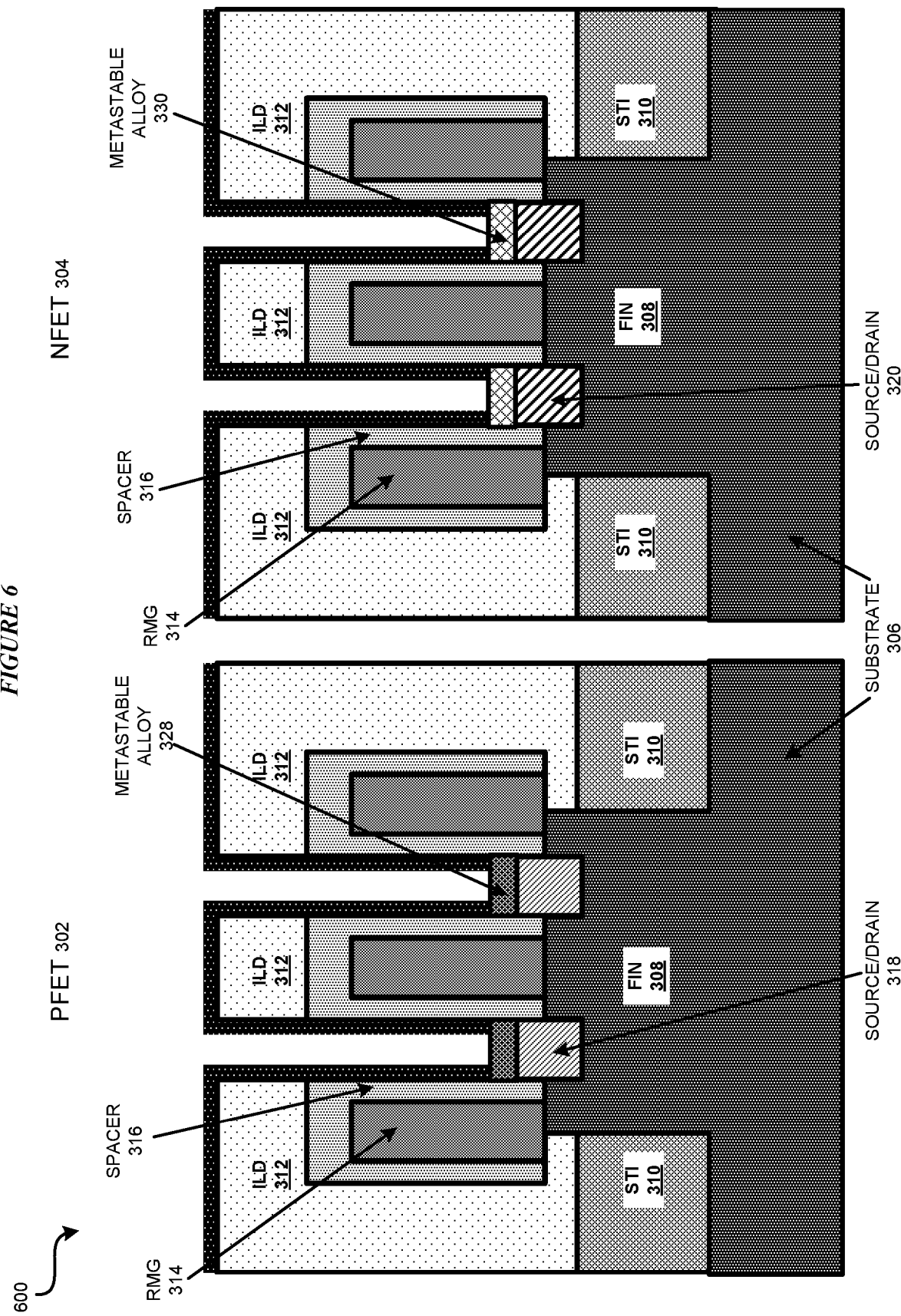
FIG. 6 depicts another portion of a process according to an illustrative embodiment.

With reference to FIG. 6, FIG. 6 depicts another example portion of a process in which a structure 600 is formed according to an embodiment. In one or more embodiments, fabrication system controlled by application 105 and fabrication control system 107 anneals amorphous layer 326 to recrystallize amorphous layer 326 to form a metastable alloy layer 328 upon p-type SD region 318 and a metastable alloy layer 330 upon n-type SD region 320. In particular embodiments, the manufacturing fabrication system controlled by application 105 and fabrication control system 107 used solid or liquid phase epitaxy to recrystallize amorphous layer 326. In one or more embodiments, the metastable alloy layer 328 upon p-type SD region 318 is an intermix of Si and Ge and p-type dopants such as B, Ga, or Al in concentrations exceeding the maximum solid solubility of p-type dopant in the resultant SiGe material in layer 328 by several fold and at least above about 5 atomic percent, and the metastable alloy layer 330 upon n-type SD region 320 is Si alloyed with P in which P is in a high concentration exceeding the maximum solid solubility of Phosphorus in Si by several fold and at least above about 5 atomic percent.

Figure 7:
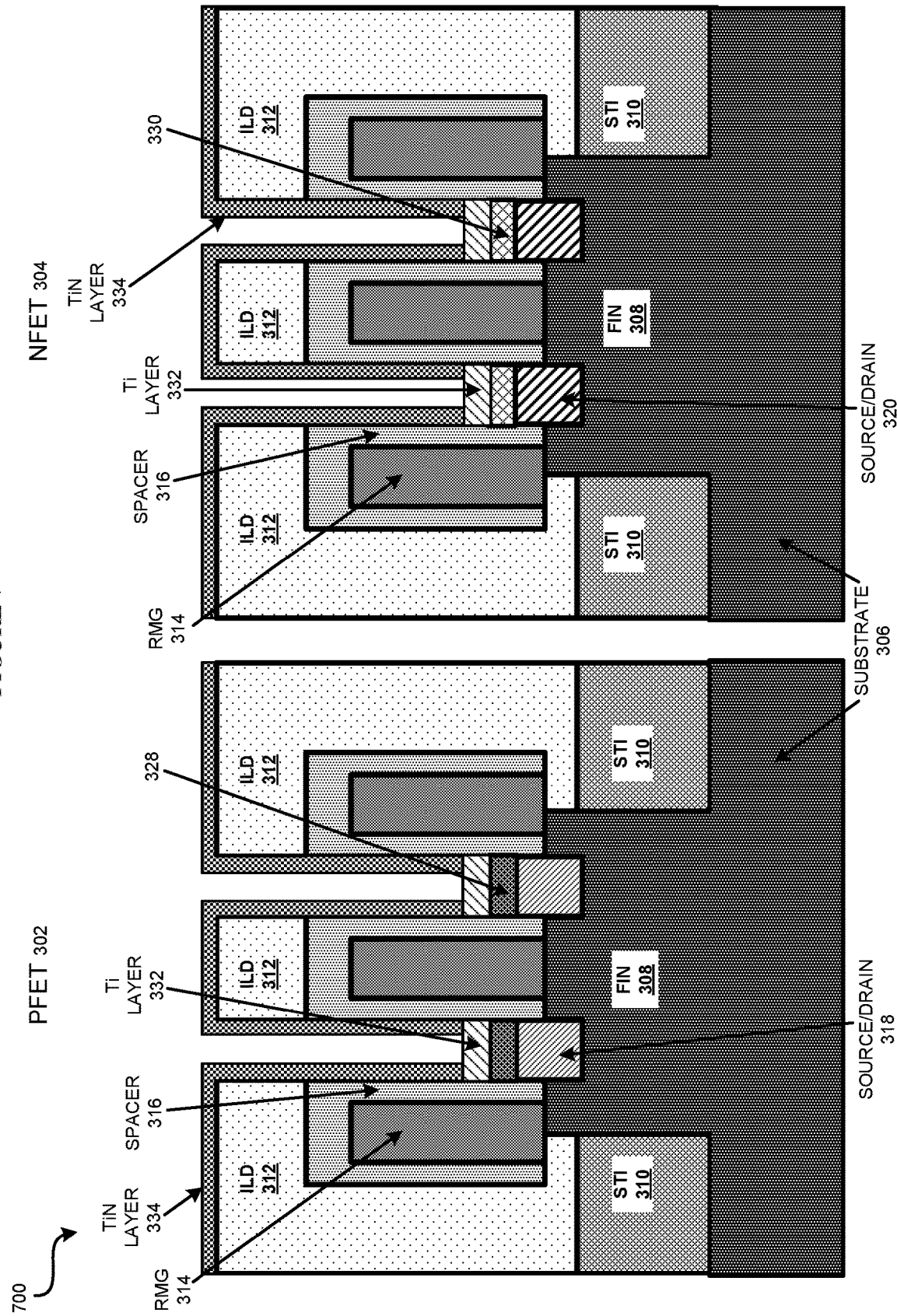
FIG. 7 depicts another portion of a process according to an illustrative embodiment.

With reference to FIG. 7, FIG. 7 depicts another example portion of a process in which a structure 700 is formed according to an embodiment. In one or more embodiments, fabrication system controlled by application 105 and fabrication control system 107 deposits one or more metal liner layers 332 upon the p-type and n-type sides. In at least one embodiment, the manufacturing fabrication system controlled by application 105 and fabrication control system 107 deposits a titanium (Ti) layer upon metastable alloy layer 328 of p-type SD region 318 and metastable alloy layer 330 of n-type SD region 320 and over exposed portions of the ILD layer 312, spacers 316, and any residual material of layer 324 that may have remained on these surfaces (not shown for clarity), and may deposit a titanium nitride (TiN) cap layer for protecting very reactive Ti material against inadvertent oxidation in the ambient air and any undesirable interactions with subsequent processes. In at least one embodiment, the thickness of Ti/TiN metal liner layers 322 is about 3 nm for Ti and about 3 nm for TiN cap. Prior to depositing metal liner 322, the surfaces of metastable alloys 328, 330 are advantageously cleaned to get rid of any native oxide including removal of Si—O, Ge—O, P—O surface chemical bonds. The sequence of cleaning steps is preferably conducted in-situ within the metal liner deposition equipment without exposing the substrate to the ambient air. The chemical oxide removal process can be employed to remove Si—O surface chemical bonds (native silicon oxide) while the thermal desorption at substrate temperatures below about 450° C. can be used for removal of Ge—O, P—O surface chemical bonds as well as other surface contaminants such as carbon and fluorine. The thermal desorption step can be conducted in reducing ambient such as hydrogen $H_2$. Further, hydrogen plasma or atomic hydrogen (H) can be employed to enhance thermal desorption at lower substrate temperatures. The metal liner 322 forms metal-semiconductor contact structures with metastable semiconductor-based alloys 328, 330. The low contact resistance is enabled by the presence of metastable semiconductor-based alloys 328, 330 and allows for selecting a wide range of metal liner material or skipping the metal liner altogether for a direct contact between metal fill and metastable alloys 328, 330. This is in contrast to a more typical approach of optimizing work function of contact metal to reduce the metal-semiconductor contact resistance that often requires a separate metal liner for p-type and n-type contacts. The selection of Ti as the contact metal in exemplary embodiment is due to its high chemical reactivity that allows for scavenging any residual oxygen, nitrogen, fluorine, and carbon that may have been present at the surfaces of alloys 328, 330 immediately prior to depositing metal liner.

Figure 8:
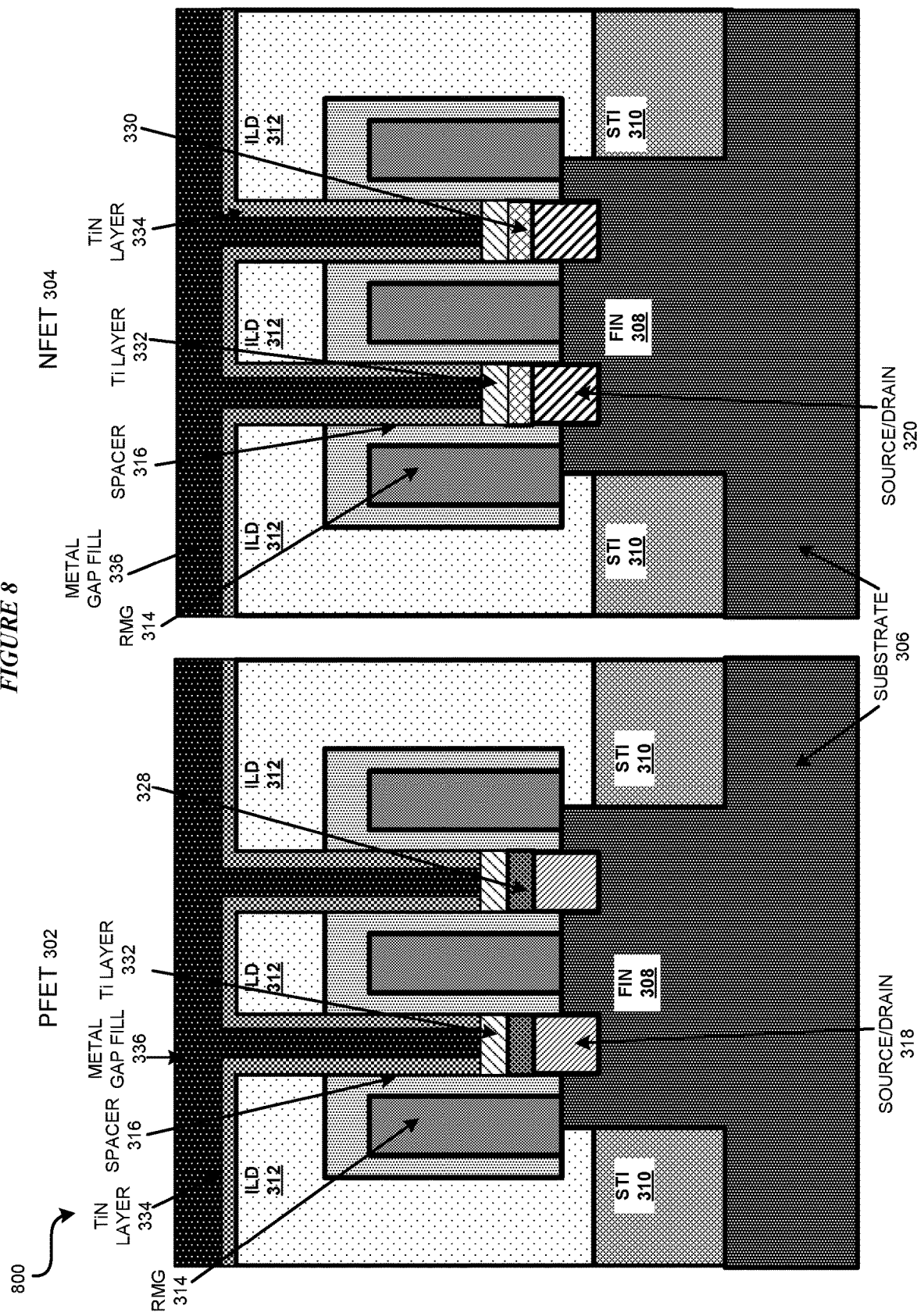
FIG. 8 depicts another portion of a process according to an illustrative embodiment.

With reference to FIG. 8, FIG. 8 depicts another example portion of a process in which a structure 800 is formed according to an embodiment. In one or more embodiments, the manufacturing fabrication system controlled by application 105 and fabrication control system 107 deposits a metal gap fill 336 upon metal liner 332 so as to fill trench 322. In a particular embodiment, the metal gap fill material is a metal material having a lower electrical resistance than the metal liner material and is typically an elemental metal such as cobalt, tungsten, or ruthenium. In some embodiments, the metal fill can be deposited directly onto cleaned surface of metastable alloys 328, 330 without any metal liner 332. Specifically, if the metal fill material is cobalt, the liner material 332 can also be cobalt if its deposition process does not contaminate the surface of metastable alloys 328, 330. One example of such process is PVD cobalt deposition for liner and CVD cobalt deposition for metal fill.

Figure 9:
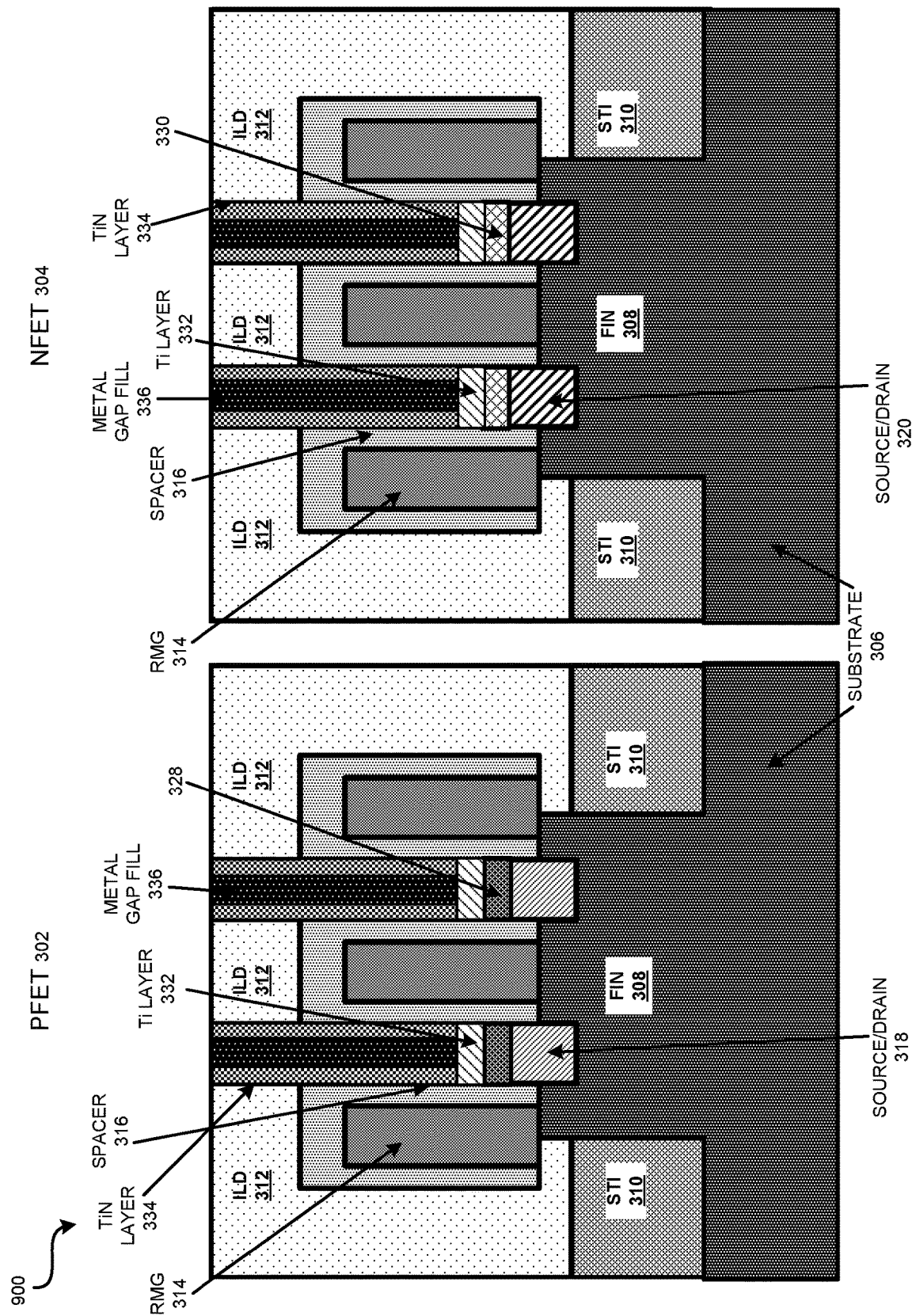
FIG. 9 depicts another portion of a process according to an illustrative embodiment.

With reference to FIG. 9, FIG. 9 depicts another example portion of a process in which a structure 900 is formed according to an embodiment. In one or more embodiments, the manufacturing fabrication system controlled by application 105 and fabrication control system 107 planarizes the metal liner layer including the metal liner layers and metal gap fill 336 to substantially remove the metal liner layer and metal gap fill 336 upon the upper portion of ILD 312. In a particular embodiment, the manufacturing fabrication system controlled by application 105 and fabrication control system 107 uses a chemical mechanical planarization (CMP) process to remove the metal liner layer and metal gap fill 336 upon the upper portion of ILD 312.

Figure 10:
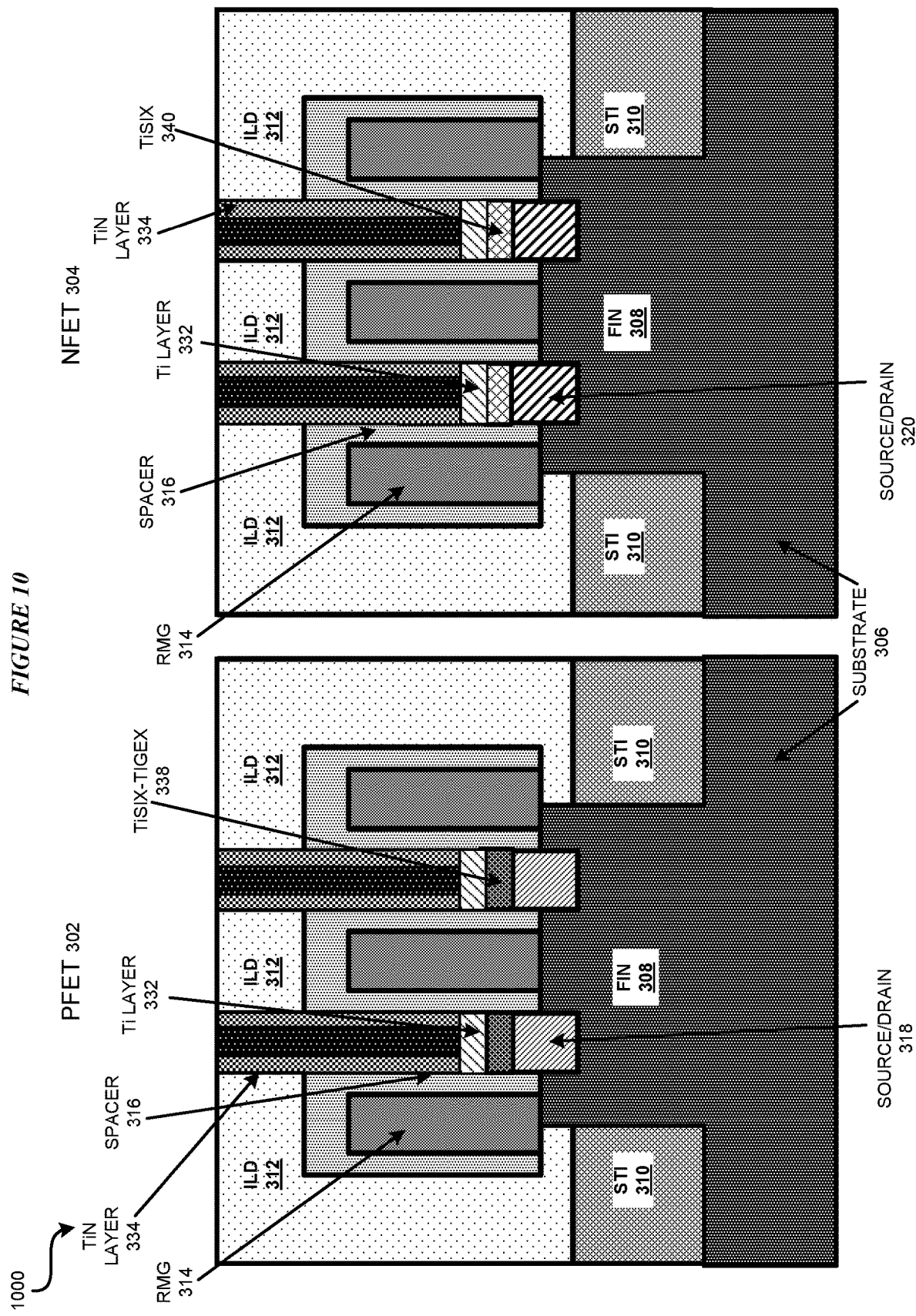
FIG. 10 depicts another portion of a process according to an illustrative embodiment.

With reference to FIG. 10, FIG. 10 depicts another example portion of a process in which a structure 1000 is formed according to an embodiment. In one or more embodiments, the manufacturing fabrication system controlled by application 105 and fabrication control system 107 anneals the metastable alloy layers 328, 330 of p-type SD region 318 of n-type SD region 320, respectively, and Ti/TiN layer 332 to form a metallic compound 340 of a germo-silicide (TiGex) and titanium silicide (TiSix) at the interface. As a result of this interfacial reaction, the metal-semiconductor contact resistance may be reduced due to a chemically cleaner interface between metastable semiconductor-based alloys and the metallic compound. However, the silicidation anneal step is optional if the interface between liner 332 and alloys 328, 330 is sufficiently chemically clean.

Figure 11:
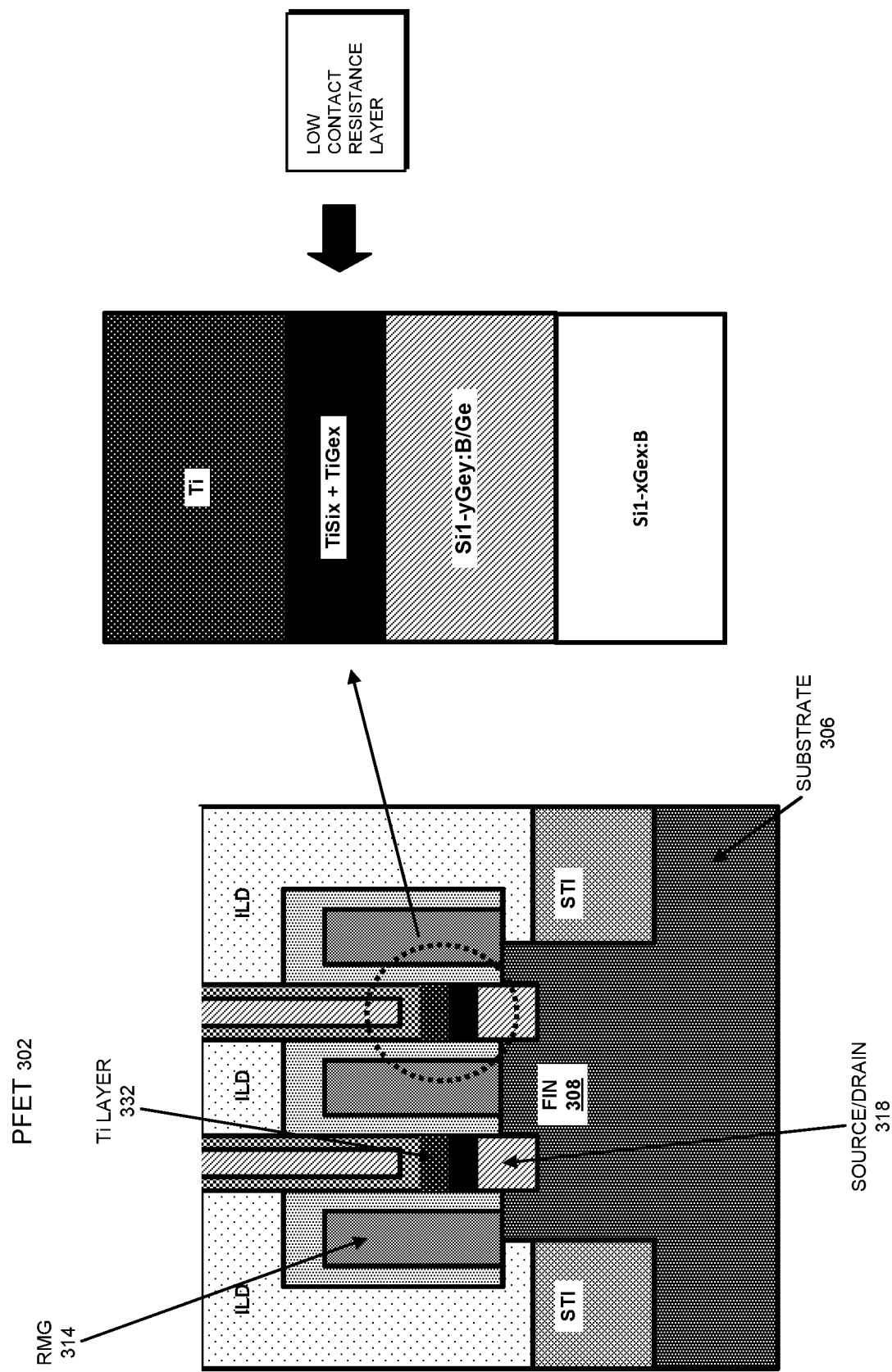
FIG. 11 depicts a cross-section of a pFET device produced by a process of FIGS. 3-10 according to an embodiment.

With reference to FIG. 11, FIG. 11 depicts a cross-section of pFET device 302 produced by the process of FIGS. 3-10 according to an embodiment. In the embodiment of FIG. 11, an enlarged view of p-type SD region 318 includes a $Si_{1-x}Ge_x$:B layer, a $Si_{1-y}Ge_y$:B/Ga layer 328 (y>x and [B/Ga]>5 atomic %), an interfacial layer of TiSix or TiGex formed thereon, followed by a Ti/TiN layer 332 formed upon the TiSix or TiGex.

Figure 12:
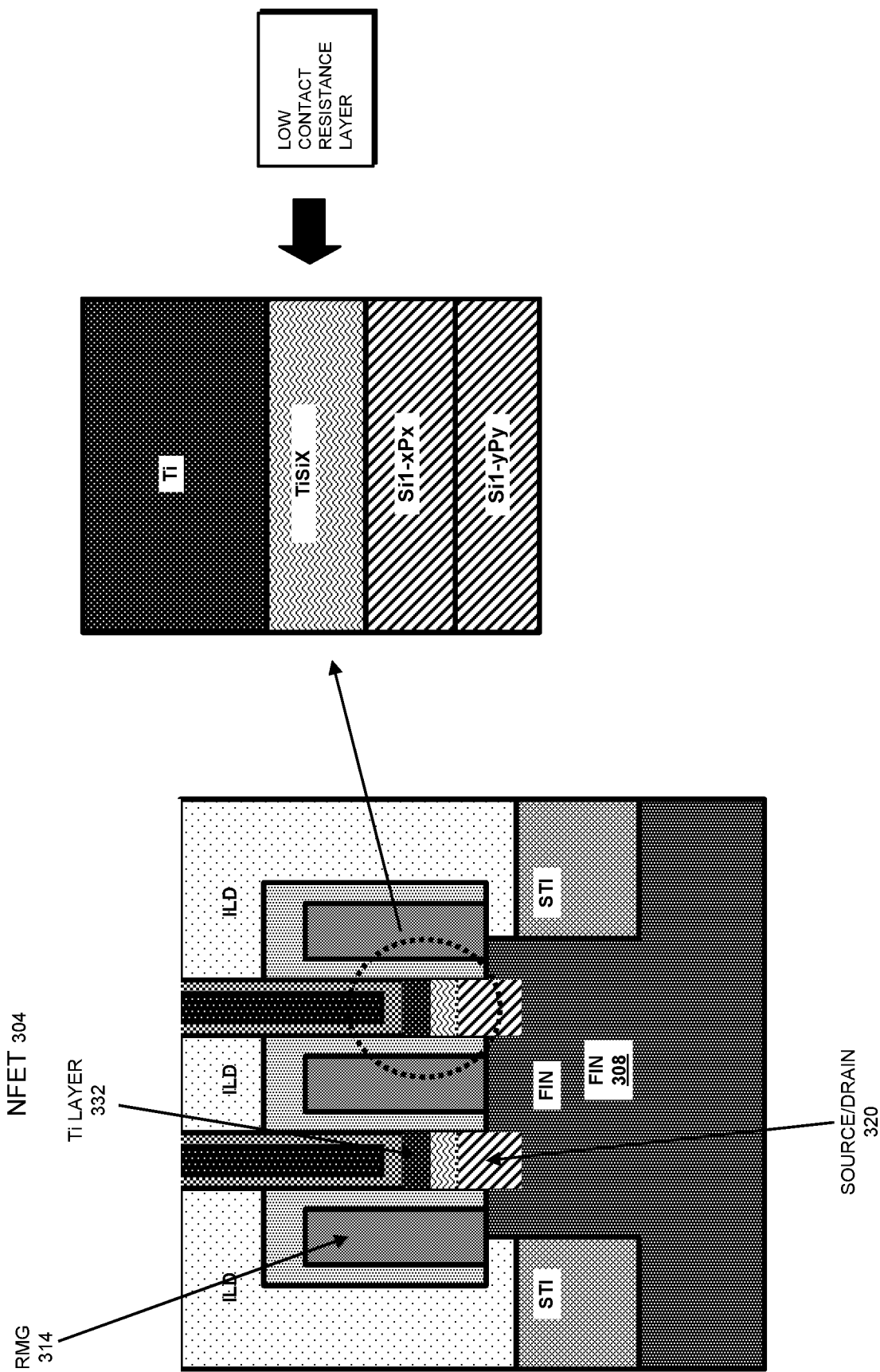
FIG. 12 depicts a cross-section of an nFET device produced by a process of FIGS. 3-10 according to an embodiment.

With reference to FIG. 12, FIG. 12 depicts a cross-section of nFET device 304 produced by the process of FIGS. 3-10 according to an embodiment. In the embodiment of FIG. 12, an enlarged view of n-type SD region 320 includes a $Si_{1-y}$:$P_y$ layer 320, $Si_{1-x}$:$P_x$ layer (x>0.05)330, an interfacial layer of TiSix formed thereon, followed by a Ti/TiN layer 332 upon the low interfacial layer.

Figure 13:
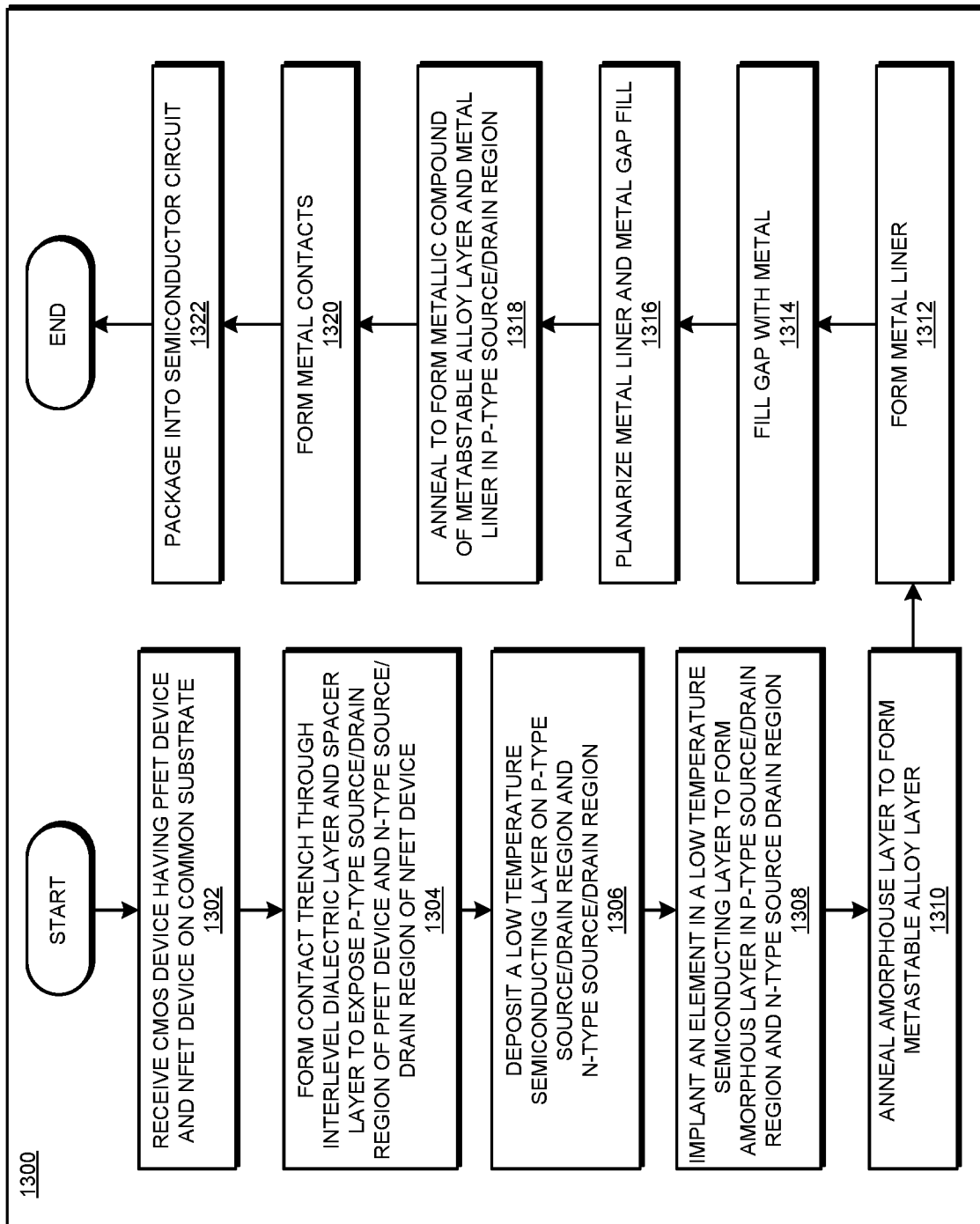
FIG. 13 depicts a flowchart of an example process for fabricating contacts for p-type field effect transistor (pFET) devices and an n-type field effect transistor (nFET) devices on the same substrate in accordance with an illustrative embodiment.

With reference to FIG. 13, FIG. 13 depicts a flowchart of an example process 1300 for fabricating contacts for pFET devices and nFET devices on the same substrate in accordance with an illustrative embodiment. Process 1300 can be implemented in a manufacturing fabrication system controlled by application 105 and fabrication control system 107 in FIG. 1, to perform one or more steps of FIGS. 3-10 as needed in process 1300.

In block 1302, a manufacturing fabrication system controlled by application 105 and fabrication control system 107 receives a semiconductor device, such as a CMOS device, having a pFET device 302 and an nFET device 304 formed on a common substrate 306. In one or more embodiments, each of pFET device 302 and nFET device 304 includes an ILD layer 312 and spacer layer 316.

In block 1304, a manufacturing fabrication system controlled by application 105 and fabrication control system 107 forms a contract trench 322 through ILD layer 312 and spacer layer 316 to expose a p-type source/drain (SD) region 318 of pFET device 302 and an n-type source/drain (SD) region 320 of nFET device 304. In block 1306, a manufacturing fabrication system controlled by application 105 and fabrication control system 107 deposits a low-temperature semiconducting layer 324 on p-type SD region 318 and n-type SD region 320.

In block 1308, a manufacturing fabrication system controlled by application 105 and fabrication control system 107 implants an element in low-temperature semiconductor layer 324 to form an amorphous layer 326 in p-type SD region 318 and n-type SD region 320 with the concentration of respective p-type and n-type dopants in amorphous layer 326 exceeding its chemical solubility in layers 324, 318, and 320. In particular embodiments, the implantation element is one of Gallium (Ga), Phosphorus (P), or germanium (Ge). In block 1310, a manufacturing fabrication system controlled by application 105 and fabrication control system 107 anneals amorphous layer 326 to form a metastable semiconductor-dopant alloy layer 328 upon p-type SD region 318 and a metastable semiconductor-dopant alloy layer 330 upon n-type SD region 320. In one or more embodiments, the metastable alloy layer 326 upon p-type SD region 318 is an intermix of silicon (Si), germanium (Ge), Boron (B), and Gallium (Ga) with Gallium (Ga) exceeding its chemical solubility in silicon-germanium (SiGe), and the metastable alloy layer 330 upon n-type SD region 320 is an intermix of silicon (Si) and Phosphorus (P) with Phosphorus (P) exceeding its chemical solubility in silicon (Si).

In block 1312, a manufacturing fabrication system controlled by application 105 and fabrication control system 107 forms one or more metal liner layers upon p-type SD region 318 and n-type SD region 320. In at least one embodiment, a manufacturing fabrication system controlled by application 105 and fabrication control system 107 deposits a titanium (Ti) layer 322 upon metastable alloy layer 328 of p-type SD region 318 and metastable alloy layer 330 of n-type SD region 320, and deposits a titanium nitride (TiN) layer 334 over exposed portions of the ILD layer 312, spacers 316, and titanium (Ti) layer 322.

In block 1314, a manufacturing fabrication system controlled by application 105 and fabrication control system 107 deposits a metal gap fill 336 upon titanium nitride (TiN) layer 334 so as to fill trench 322. In a particular embodiment, the metal gap fill material is a metal material having a high resistance to temperature and low electrical resistivity such as cobalt, ruthenium, or tungsten. In block 1316, a manufacturing fabrication system controlled by application 105 and fabrication control system 107 planarizes the metal liner layers and metal gap fill 336 to substantially remove the metal liner layer and metal gap fill 336 from the upper portion of ILD 312. In a particular embodiment, a manufacturing fabrication system controlled by application 105 and fabrication control system 107 uses a chemical mechanical planarization (CMP) process to remove the metal liner layer and metal gap fill 336 upon the upper portion of ILD 312.

In block 1318, a manufacturing fabrication system controlled by application 105 and fabrication control system 107 anneals the metastable alloy layer 328 and Ti layer 332 of p-type SD region 318 to form a metallic silicide compound 338 such as titanium silicide (TiSix) or germo-silicide (TiGex). In one or more embodiments, a manufacturing fabrication system controlled by application 105 and fabrication control system 107 further anneals metastable alloy layer 328 and Ti layer 332 of n-type SD region 320 to form a metallic compound 340 such as titanium silicide (TiSix). In the exemplar embodiment, a manufacturing fabrication system controlled by application 105 and fabrication control system 107 employs a millisecond anneal at about 800° C. with the duration of less than 500 microseconds at above about 700° C. to form the interfacial metallic compounds 338 and 340 simultaneously.

In block 1320, a manufacturing fabrication system controlled by application 105 and fabrication control system 107 forms separate metal contacts to the metal gap fill material 336 in trenches 322 connected to p-type SD region 318 and the metal gap fill material 336 in trenches 322 connected to n-type SD region 320. The metal contacts and associated wires tie up the independent pFETs 302 and nFETs 304 into an integrated circuit. In block 1322, a manufacturing fabrication system controlled by application 105 and fabrication control system 107 packages the resultant semiconductor circuit structure into a semiconductor integrated circuit package also known as an IC chip.

In one or more embodiments, the block 1318 can be performed after the block 1312 and prior to the block 1314. In one or more embodiments, the blocks 1312 and 1318 can be skipped.

Thus, a computer implemented method, system or apparatus, and computer program product are provided in the illustrative embodiments for fabricating contacts for pFET devices and nFET devices on a common substrate and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD- ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for fabricating a semiconductor device comprising:
depositing a semiconductor material layer on a p-type source/drain region of a p-type transistor device and an n-type source/drain region of an n-type transistor device, the p-type transistor device and the n-type transistor device being formed on a substrate of a semiconductor device, the semiconductor device including a trench formed through an inter-level dielectric layer, the inter-level dielectric layer being formed over the n-type transistor device and the p-type transistor device, the trench exposing the p-type source/drain region of the p-type transistor device and exposing the n-type source/drain region of the n-type transistor device;
implanting an element in the semiconductor material layer to form an amorphous layer on the p-type source/drain region and the n-type source/drain region, wherein the implanting of the element to form the amorphous layer comprises implanting an electrically neutral element selected from one of silicon (Si), germanium (Ge), or noble gases; and annealing the amorphous layer to form a first metastable alloy layer upon the p-type source/drain region and a second metastable alloy layer upon the n-type source/drain region.

2. The method of claim 1, further comprising depositing at least one metal layer upon the p-type source/drain region and the n-type source/drain region.

3. The method of claim 2, further comprising forming metal wires to the p-type source/drain region and the n-type source/drain region.

4. The method of claim 2, further comprising annealing the first and the second metastable alloy layers and the metal layer to form a metal-semiconductor metallic compound at interfaces of the first and the second metastable alloy layers and the metal layer.

5. The method of claim 1, wherein the semiconductor material layer comprises a low-temperature silicon (Si) layer of less than 5 nanometer thick deposited at temperature of less than 500 C.

6. The method of claim 1, wherein the semiconductor material layer comprises a low-temperature silicon germanium (SiGe) layer of less than 10 nanometer thick deposited at temperatures of less than 500 C.

7. The method of claim 1, wherein the annealing comprises a millisecond annealing at or above recrystallization temperature of amorphous layers.

8. The method of claim 1, wherein the annealing comprises a nanosecond annealing at or above melting temperature of amorphous layers.

9. The method of claim 1, wherein the implanting of the element to form the amorphous layer comprises of implanting a first dopant element of a first polarity, blocking the device of the first polarity by a block mask, and implanting a second dopant element of a second polarity into the device of the second polarity.

10. The method of claim 9, further comprising etching an amorphous layer of the first polarity prior to implanting a dopant element of the second polarity.

11. The method of claim 9, wherein the dopant element of the first polarity is selected from Gallium (Ga) or Boron (B) and the dopant element of the second polarity is selected from Phosphorus (P) or Arsenic (As).

12. The method of claim 11, wherein an implanted dose of the dopant element of the second polarity is larger than an implanted dose of the dopant element of the first polarity.

* * * * *